(12) United States Patent
Dhingra et al.

(10) Patent No.: US 6,656,268 B2
(45) Date of Patent: Dec. 2, 2003

(54) SYNTHETIC POROUS CRYSTALLINE MCM-70, ITS SYNTHESIS AND USE

(75) Inventors: Sandeep S. Dhingra, Midland, MI (US); Simon C. Weston, Annandale, NJ (US)

(73) Assignee: ExxonMobil Oil Corporation, Fair Fax, VA (US)

( * ) Notice: Subject to any disclaimer, the term of this patent is extended or adjusted under 35 U.S.C. 154(b) by 0 days.

(21) Appl. No.: 10/057,592

(22) Filed: Jan. 25, 2002

(65) Prior Publication Data

US 2002/0174824 A1 Nov. 28, 2002

Related U.S. Application Data

(60) Provisional application No. 60/264,470, filed on Jan. 26, 2001.

(51) Int. Cl.$^7$ ............................................. C30B 25/00
(52) U.S. Cl. ........................... 117/68; 117/2; 585/446
(58) Field of Search ........................ 117/2, 68; 585/446

(56) References Cited

U.S. PATENT DOCUMENTS 6,049,018 A    4/2000   Calabro et al. ............. 585/446

*Primary Examiner*—Felisa Hiteshew

(57) ABSTRACT

This invention relates to a new synthetic porous crystalline material, designated MCM-70, having, in its calcined form, the x-ray diffraction pattern of Table 1 above. The invention further resides in a method for preparing MCM-70 in borosilicate and in the conversion of organic compounds contacted with an active form of MCM-70.

8 Claims, 2 Drawing Sheets

Powder X-Ray Diffraction Pattern of As-Synthesized MCM-70

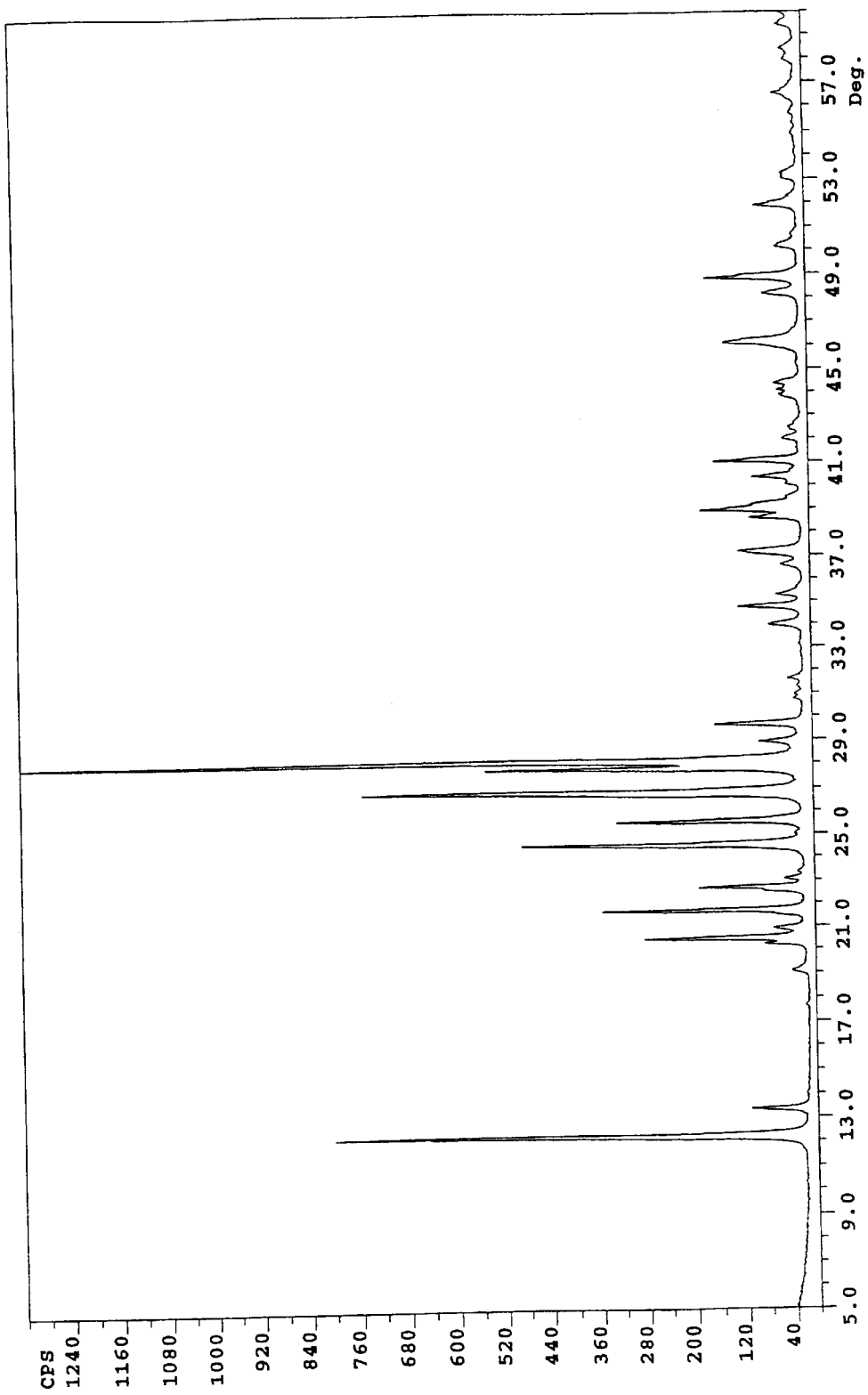
Figure 1. Powder X-Ray Diffraction Pattern of As-Synthesized MCM-70

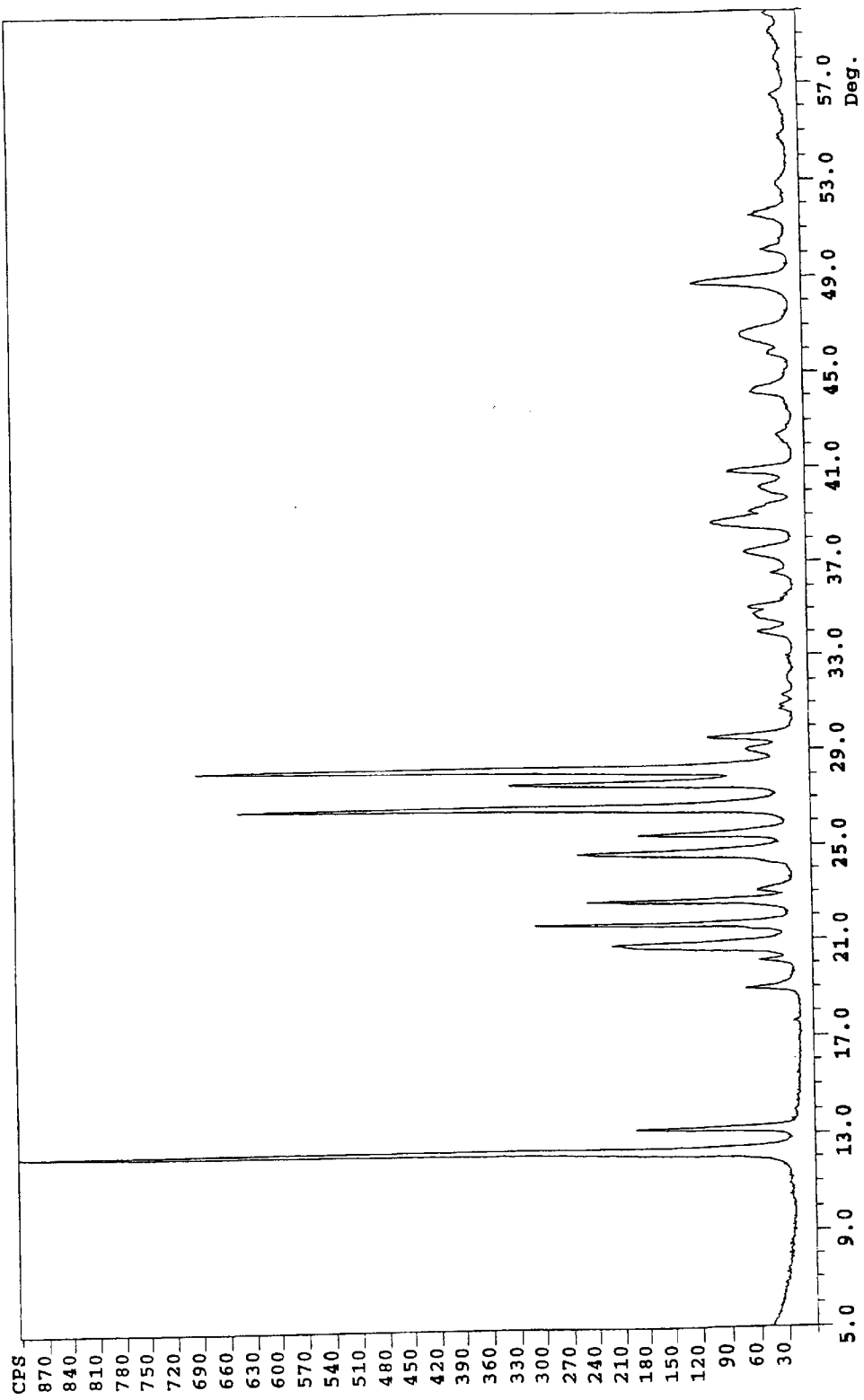
Figure 2. Powder X-Ray Diffraction Pattern of Calcined MCM-70

SYNTHETIC POROUS CRYSTALLINE MCM-70, ITS SYNTHESIS AND USE

CROSS-REFERENCE TO RELATED APPLICATIONS

This application claims priority to application Ser. No. 60/264,470, filed Jan. 26, 2001, which is hereby incorporated by reference.

BACKGROUND OF THE INVENTION

1. Field of the Invention

This invention relates to a novel synthetic porous crystalline material, MCM-70, to a method for its preparation and to its use in catalytic conversion of organic compounds.

2. Description of the Prior Art

Zeolitic materials, both natural and synthetic, have been demonstrated in the past to have catalytic properties for various types of hydrocarbon conversion. Certain zeolitic materials are ordered, porous crystalline metallosilicates having a definite crystalline structure as determined by X-ray diffraction, within which there are a large number of smaller cavities which may be interconnected by a number of still smaller channels or pores. These cavities and pores are uniform in size within a specific zeolitic material. Since the dimensions of these pores are such as to accept for adsorption molecules of certain dimensions while rejecting those of larger dimensions, these materials have come to be known as "molecular sieves" and are utilized in a variety of ways to take advantage of these properties.

Such molecular sieves, both natural and synthetic, include a wide variety of positive ion-containing crystalline silicates. These silicates can be described as a rigid three-dimensional framework of $SiO_4$ and Periodic Table Group IIIA element oxide, e.g., $AlO_4$, in which the tetrahedra are cross-linked by the sharing of oxygen atoms whereby the ratio of the total Group IIIA element and silicon atoms to oxygen atoms is 1:2. The electrovalence of the tetrahedra containing the Group IIIA element is balanced by the inclusion in the crystal of a cation, for example an alkali metal or an alkaline earth metal cation. This can be expressed wherein the ratio of the Group IIIA element, e.g., aluminum, to the number of various cations, such as Ca/2, Sr/2, Na, K or Li, is equal to unity. One type of cation may be exchanged either entirely or partially with another type of cation utilizing ion exchange techniques in a conventional manner. By means of such cation exchange, it has been possible to vary the properties of a given silicate by suitable selection of the cation. The spaces between the tetrahedra are occupied by molecules of water prior to dehydration.

Prior art techniques have resulted in the formation of a great variety of synthetic zeolites. Many of these zeolites have come to be designated by letter or other convenient symbols, as illustrated by zeolite A (U.S. Pat. No. 2,882, 243); zeolite X (U.S. Pat. No. 2,882,244); zeolite Y (U.S. Pat. No. 3,130,007); zeolite ZK-5 (U.S. Pat. No. 3,247,195); zeolite ZK-4 (U.S. Pat. No. 3,314,752); zeolite ZSM-5 (U.S. Pat. No. 3,702,886); zeolite ZSM-11 (U.S. Pat. No. 3,709, 979); zeolite ZSM-12 (U.S. Pat. No. 3,832,449), zeolite ZSM-20 (U.S. Pat. No. 3,972,983); ZSM-35 (U.S. Pat. No. 4,016,245); zeolite ZSM-23 (U.S. Pat. No. 4,076,842); zeolite MCM-22 (U.S. Pat. No. 4,954,325); and zeolite MCM-35 (U.S. Pat. No. 4,981,663), merely to name a few.

Although most frequently encountered in aluminosilicate form, many zeolites are known in borosilicate forms. For example, AMS1B is a borosilicate form of ZSM-5 and is disclosed in U.S. Pat. No. 4,269,813, whereas GB-A-2,024, 790 discloses borosilicate forms of zeolite beta (boralite B), ZSM-5 (boralite C) and ZSM-11 (boralite D).

Many zeolites are synthesized in the presence of an organic directing agent, such as an organic nitrogen compound. For example, ZSM-5 may be synthesized in the presence of tetrapropylammonium cations and zeolite MCM-22 may be synthesized in the presence of hexamethyleneimine. It is also possible to synthesize zeolites and related molecular sieves in the presence of rigid polycyclic quaternary directing agents (see, for example U.S. Pat. Nos. 5,501,848 and 5,225,179), flexible diquaternary directing agents (Zeolites, [1994], 14, 504) and rigid polycyclic diquaternary directing agents (JACS, [1992], 114, 4195).

U.S. Pat. No. 6,049,018 discloses the novel zeolite MCM-68 and its synthesis using the novel dications N,N,N',N'-tetraalkylbicyclo[2.2.2]oct-7-ene-2,3:5,6-dipyrrolidinium dication and N,N,N',N'-tetraalkylbicyclo[2.2.2]octane-2,3:5, 6-dipyrrolidinium dication. According to the present invention, it has now been found that the N,N'-dipropyl-N, N'-diethyl and N,N'-diisopropyl-N,N'-dipropyl forms of these cations can be used to synthesize the borosilicate form of a novel zeolite, named MCM-70.

SUMMARY OF THE INVENTION

The present invention is directed to a novel porous crystalline material, MCM-70, having, in its calcined form, an X-ray diffraction pattern including values substantially as set forth in Table 1 below.

The invention further resides in a method for preparing MCM-70 in borosilicate form and in the conversion of organic compounds contacted with an active form of MCM-70.

DESCRIPTION OF DRAWINGS

FIG. 1 shows the X-ray diffraction pattern of the as-synthesized product of Example 7.

FIG. 2 shows the X-ray diffraction pattern of the as-calcined product of Example 7.

DESCRIPTION OF SPECIFIC EMBODIMENTS

The synthetic porous crystalline material of this invention, MCM-70, is a single crystalline phase which, in its calcined form, has an X-ray diffraction pattern which is distinguished from the patterns of other known as-synthesized or thermally treated crystalline materials by the lines listed in Table 1 below. In its as-synthesized form, the crystalline MCM-70 material of the invention has an X-ray diffraction pattern which is distinguished from the patterns of other known as-synthesized or thermally treated crystalline materials by the lines listed in Table 2 below.

TABLE 1

| $d_{hkl}$ (Å) | 100 $I_o/I_{max}$ |
| --- | --- |
| 7.23 ± 0.32 | vs |
| 6.71 ± 0.25 | vw - w |
| 4.28 ± 0.20 | vw - w |
| 4.11 ± 0.32 | w - m |
| 3.93 ± 0.29 | w - m |
| 3.61 ± 0.16 | w - m |
| 3.50 ± 0.23 | vw - w |
| 3.35 ± 0.13 | s - vs |
| 3.23 ± 0.20 | w - m |
| 3.16 ± 0.21 | s - vs |

TABLE 1-continued

| $d_{hkl}$ (Å) | 100 $I_o/I_{max}$ |
|---|---|
| 3.02 ± 0.18 | vw |
| 2.40 ± 0.11 | vw |
| 2.33 ± 0.11 | vw |
| 2.21 ± 0.18 | vw |
| 1.95 ± 0.11 | vw |
| 1.87 ± 0.13 | vw |

TABLE 2

| $d_{hkl}$ (Å) | Relative Intensity |
|---|---|
| 7.25 ± 0.32 | m - vs |
| 6.63 ± 0.25 | vw |
| 4.33 ± 0.20 | vw - w |
| 4.10 ± 0.32 | vw - w |
| 3.92 ± 0.29 | vw |
| 3.63 ± 0.16 | w - m |
| 3.49 ± 0.23 | w - m |
| 3.32 ± 0.13 | m - s |
| 3.21 ± 0.19 | w - m |
| 3.17 ± 0.21 | s - vs |
| 3.01 ± 0.18 | vw - w |
| 2.42 ± 0.11 | vw - w |
| 2.31 ± 0.11 | vw - w |
| 2.19 ± 0.18 | vw - w |
| 1.97 ± 0.10 | vw - w |
| 1.86 ± 0.13 | vw - w |

These X-ray diffraction data were collected with a Scintag diffraction system, equipped with a germanium solid state detector, using copper K-alpha radiation. The diffraction data were recorded by step-scanning at 0.02 degrees of two-theta, where theta is the Bragg angle, and a counting time of 10 seconds for each step. The interplanar spacing, d's, were calculated in Angstrom units, and the relative intensities of the lines, $I/I_o$ is one-hundredth of the intensity of the strongest line, above background, were derived with the use of a profile fitting routine (or second derivative algorithm). The intensities are uncorrected for Lorentz and polarization effects. The relative intensities are given in terms of the symbols vs=very strong (80–100), s=strong (60–80), m=medium (40–60), w=weak (20–40), and vw=very weak (0–20). It should be understood that diffraction data listed for this sample as single lines may consist of multiple overlapping lines which under certain conditions, such as differences in crystallographic changes, may appear as resolved or partially resolved lines. Typically, crystallographic changes can include minor changes in unit cell parameters and/or a change in crystal symmetry, without a change in the structure. These minor effects, including changes in relative intensities, can also occur as a result of differences in cation content, framework composition, nature and degree of pore filling, crystal size and shape, preferred orientation and thermal and/or hydrothermal history.

The crystalline material of this invention has a composition involving the molar relationship:

$$X_2O_3:(n)YO_2,$$

wherein X is a trivalent element, such as aluminum, boron, iron, indium, and/or gallium, preferably boron; Y is a tetravalent element such as silicon, tin, titanium and/or germanium, preferably silicon; and n is at least about 2, such as 2 to 100,000, and usually from about 5 to about 100. In the as-synthesized form, the material has a formula, on an anhydrous basis and in terms of moles of oxides per n moles of $YO_2$, as follows:

$$(0.05-2)M_2O:(0.01-2)Q:X_2O_3:(n)YO_2$$

wherein M is an alkali or alkaline earth metal, normally potassium, and Q is an organic moiety. The M and Q components are associated with the material as a result of their presence during crystallization and are easily removed by post-crystallization crystallization methods hereinafter more particularly described.

The crystalline material of the invention is thermally stable and in the calcined form exhibits a high surface area and significant hydrocarbon sorption capacity.

To the extent desired, the original sodium and/or potassium cations of the as-synthesized material can be replaced in accordance with techniques well known in the art, at least in part, by ion exchange with other cations. Preferred replacing cations include metal ions, hydrogen ions, hydrogen precursor, e.g., ammonium ions and mixtures thereof. Particularly preferred cations are those which tailor the catalytic activity for certain hydrocarbon conversion reactions. These include hydrogen, rare earth metals and metals of Groups IIA, IIIA, IVA, VA, IB, IIB, IIIB, IVB, VB, VIB, VIIB and VIII of the Periodic Table of the Elements.

The crystalline material of the invention may be subjected to treatment to remove part or all of any organic constituent. This is conveniently effected by thermal treatment in which the as-synthesized material is heated at a temperature of at least about 370° C. for at least 1 minute and generally not longer than 20 hours. While subatmospheric pressure can be employed for the thermal treatment, atmospheric pressure is desired for reasons of convenience. The thermal treatment can be performed at a temperature up to about 925° C. The thermally treated product, especially in its metal, hydrogen and ammonium forms, is particularly useful in the catalysis of certain organic, e.g., hydrocarbon, conversion reactions.

The crystalline material of the invention can be intimately combined with a hydrogenating component such as tungsten, vanadium, molybdenum, rhenium, nickel, cobalt, chromium, manganese, or a noble metal such as platinum or palladium where a hydrogenation-dehydrogenation function is to be performed. Such component can be in the composition by way of cocrystallization, exchanged into the composition to the extent a Group IIIA element, e.g., aluminum, is in the structure, impregnated therein or intimately physically admixed therewith. Such component can be impregnated in or on to it such as, for example, by, in the case of platinum, treating the silicate with a solution containing a platinum metal-containing ion. Thus, suitable platinum compounds for this purpose include chloroplatinic acid, platinous chloride and various compounds containing the platinum amine complex.

The crystalline material of this invention, when employed either as an adsorbent or as a catalyst in an organic compound conversion process should be dehydrated, at least partially. This can be done by heating to a temperature in the range of 200° C. to about 370° C. in an atmosphere such as air, nitrogen, etc., and at atmospheric, subatmospheric or superatmospheric pressures for between 30 minutes and 48 hours. Dehydration can also be performed at room temperature merely by placing the MCM-70 in a vacuum, but a longer time is required to obtain a sufficient amount of dehydration.

The borosilicate form of the crystalline material of the invention can be prepared from a reaction mixture containing sources of alkali or alkaline earth metal (M), e.g., potassium cation, an oxide of boron, an oxide of tetravalent element Y, e.g., silicon, a directing agent (Q) as described below, and water, said reaction mixture having a composition, in terms of mole ratios of oxides, within the following ranges:

| Reactants | Useful | Preferred |
|---|---|---|
| $YO_2/B_2O_3$ | 2–100,000 | 5–100 |
| $H_2O/YO_2$ | 10–1000 | 20–50 |
| $OH^-/YO_2$ | 0.05–2 | 0.2–0.8 |
| $M/YO_2$ | 0.05–2 | 0.2–0.8 |
| $Q/YO_2$ | 0.01–2 | 0.1–0.3 |

The organic directing agent Q used herein is selected from N,N'-dipropyl-N,N'-diethylbicyclo[2.2.2]oct-7-ene-2,3:5,6-dipyrrolidinium dication, N,N'-dipropyl-N,N'-diethylbicyclo[2.2.2]octane-2,3:5,6-dipyrrolidinium dication, N,N'-diisopropyl-N,N'-dipropylbicyclo[2.2.2]oct-7-ene-2,3:5,6-dipyrrolidinium dication and N,N'-diisopropyl-N,N'-dipropylbicyclo[2.2.2]octane-2,3:5,6-dipyrrolidinium dication which can be represented by the following formulae:

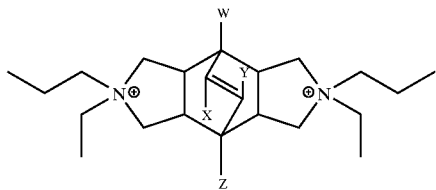

N,N'-dipropyl-N,N'-diethylbicyclo[2.2.2]oct-7-ene-2,3:5,6-dipyrrolidinium

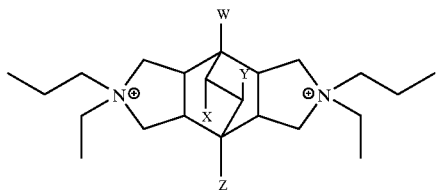

N,N'-dipropyl-N,N'-diethylbicyclo[2.2.2]octane-2,3:5,6-dipyrrolidinium

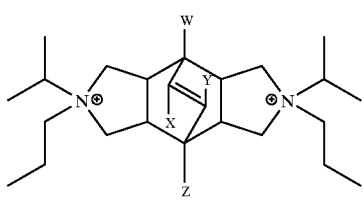

N,N'-diisopropyl-N,N'-dipropylbicyclo[2.2.2]oct-7-ene-2,3:5,6-dipyrrolidinium

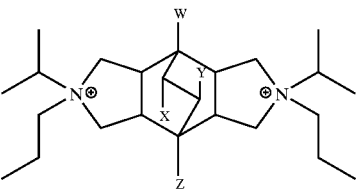

N,N'-diisopropyl-N,N'-dipropylbicylo[2.2.2]octane-2,3:5,6-dipyrrolidinium where W, X, Y, Z may be the same or different substituents selected from hydrogen, alkyl groups having 1 to 6 carbon atoms, phenyl groups and halogens and preferably are hydrogen.

The source of the organic dication may be any salt which is not detrimental to the formation of the crystalline material of the invention, for example, the halide, e.g., iodide, or hydroxide salt.

The novel organic dications used to synthesize the MCM-70 of the invention can be prepared from, for example, bicyclo[2.2.2]oct-7-ene-2,3:5,6-tetracarboxylic dianhydride, which is a commercially available material. For instance the N,N'-dipropyl-N,N'-diethylbicyclo[2.2.2]oct-7-ene-2,3:5,6-dipyrrolidinium dication can be prepared from the dianhydride which is initially reacted with propylamine to produce the bicyclo N,N'-dipropyl diimide which is then reduced with $LiAlH_4$ to produce the diamine. The diamine can then be alkylated with an ethyl halide, for example iodoethane, to produce the N,N'-dipropyl-N,N'-diethyl quaternary dication. Similarly, the bicyclooctane diquat can be produced from the bicyclooctane dianhydride, which is known in the literature, or can be prepared by hydrogenation of the bicyclooctene dianhydride.

Crystallization of MCM-70 can be carried out at either static or stirred conditions in a suitable reactor vessel, such as for example, polypropylene jars or teflon lined or stainless steel autoclaves, at a temperature of 100° C. to about 240° C. for a time sufficient for crystallization to occur at the temperature used, e.g., from about 5 hours to about 24 days. Thereafter, the crystals are separated from the liquid and recovered.

It should be realized that the reaction mixture components can be supplied by more than one source. The reaction mixture can be prepared either batch-wise or continuously. Crystal size and crystallization time of the new crystalline material will vary with the nature of the reaction mixture employed and the crystallization conditions.

Synthesis of the new crystals may be facilitated by the presence of at least 0.01 percent, preferably 0.10 percent and still more preferably 1 percent, seed crystals (based on total weight) of crystalline product.

The crystals prepared by the instant invention can be shaped into a wide variety of particle sizes. Generally speaking, the particles can be in the form of a powder, a granule, or a molded product, such as an extrudate having particle size sufficient to pass through a 2 mesh (Tyler) screen and be retained on a 400 mesh (Tyler) screen. In cases where the catalyst is molded, such as by extrusion, the crystals can be extruded before drying or partially dried and then extruded.

The crystalline material of this invention can be used as an adsorbent or, particularly in its aluminosilicate form, as a catalyst to catalyze a wide variety of chemical conversion processes including many of present commercial/industrial importance. Examples of chemical conversion processes which are effectively catalyzed by the crystalline material of this invention, by itself or in combination with one or more other catalytically active substances including other crystalline catalysts, include those requiring a catalyst with acid activity.

As in the case of many catalysts, it may be desirable to incorporate the new crystal with another material resistant to the temperatures and other conditions employed in organic conversion processes. Such materials include active and inactive materials and synthetic or naturally occurring zeolites as well as inorganic materials such as clays, silica and/or metal oxides such as alumina. The latter may be either naturally occurring or in the form of gelatinous precipitates or gels including mixtures of silica and metal oxides. Use of a material in conjunction with the new crystal, i.e., combined therewith or present during synthesis of the new crystal, which is active, tends to change the conversion and/or selectivity of the catalyst in certain organic conversion processes. Inactive materials suitably serve as diluents to control the amount of conversion in a given process so that products can be obtained economically and orderly without employing other means for controlling the rate of reaction. These materials may be incorporated into naturally occurring clays, e.g., bentonite and kaolin, to improve the crush strength of the catalyst under commercial operating conditions. Said materials, i.e., clays, oxides, etc., function as binders for the catalyst. It is desirable to provide a catalyst having good crush strength because in commercial use it is desirable to prevent the catalyst from breaking down into powder-like materials. These clay and/or oxide binders have been employed normally only for the purpose of improving the crush strength of the catalyst.

Naturally occurring clays which can be composited with the new crystal include the montmorillonite and kaolin family, which families include the subbentonites, and the kaolins commonly known as Dixie, McNamee, Georgia and Florida clays or others in which the main mineral constituent is halloysite, kaolinite, dickite, nacrite, or anauxite. Such clays can be used in the raw state as originally mined or initially subjected to calcination, acid treatment or chemical modification. Binders useful for compositing with the present crystal also include inorganic oxides, such as silica, zirconia, titania, magnesia, beryllia, alumina, and mixtures thereof.

In addition to the foregoing materials, the new crystal can be composited with a porous matrix material such as silica-alumina, silica-magnesia, silica-zirconia, silica-thoria, silica-beryllia, silica-titania as well as ternary compositions such as silica-alumina-thoria, silica-alumina-zirconia silica-alumina-magnesia and silica-magnesia-zirconia.

The relative proportions of finely divided crystalline material and inorganic oxide matrix vary widely, with the crystal content ranging from about 1 to about 90 percent by weight and more usually, particularly when the composite is prepared in the form of beads, in the range of about 2 to about 80 weight percent of the composite.

In order to more fully illustrate the nature of the invention and the manner of practicing same, the following examples are presented.

EXAMPLE 1

Synthesis of N,N'-Dipropylbicyclo[2.2.2]oct-7-ene-2,3:5,6-tetracarboxylic Diimide (Bicyclo NPr$_2$ Diimide)

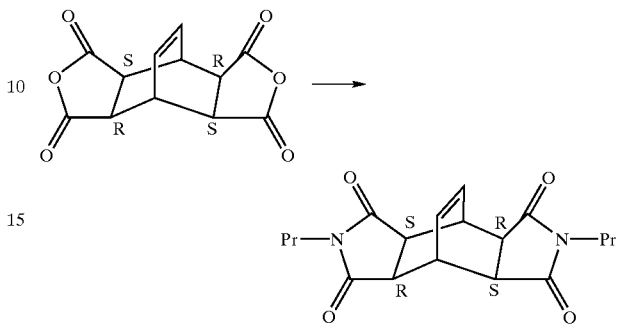

R,S—Notation Defines the Stereochemistry

To a 2000 mL 3-necked round bottomed flask equipped with a magnetic stirring bar, a reflux condenser, a thermometer and a pressure equalized dropping funnel charged with water (600 mL) were attached. The flask was then charged with propylamine (472.89 g, 8 moles) followed by bicyclo [2.2.2]oct-7-ene-2,3:5,6-tetracarboxylic dianhydride (99.28 g, 0.4 moles) in portions along with vigorous stirring. After two hours of stirring at room temperature, the water was carefully added. The mixture was then stirred at 70° C. for 48 hours. The reaction was then cooled to room temperature and the majority of the remaining propylamine distilled off until the reaction volume was ~500 mL. Then water was added (600 mL) and the remaining propylamine quenched with concentrated HCl in a drop-wise fashion. The solid was then filtered under suction, washed with water (200 mL) and dried in a vacuum dessicator over drierite to give 123.78 g (94%) of diimide as white solids.

Melting Point: 219.4–220.7° C.

$^{13}$C in CDCl$_3$ (δ/ppm): 11.235; 20.965; 33.521; 40.547; 42.886; 130.971; 176.710.

$^1$H in CDCl$_3$ (δ/ppm): 0.84 (6H, t); 1.50 (4H, q6); 2.97 (4H, t); 3.38 (4H, t); 3.78 (2H, m); 6.12 (2H, dd).

Combustion Analysis for C$_{18}$H$_{22}$N$_2$O$_4$:

|  | % C | % H | % N |
|---|---|---|---|
| Calculated | 65.44 | 6.71 | 8.48 |
| Found | 65.45 | 6.72 | 8.43 |

Example 2

Synthesis of N,N'-Dipropylbicyclo[2.2.2]oct-7-ene-2,3:5,6-dipyrrolidine (Bicyclo NPr$_2$ Diamine)

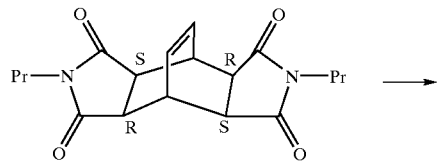

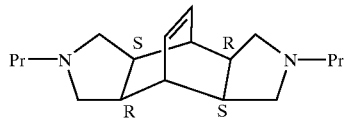

R,S—Notation Defines the Stereochemistry

A 5000 mL, 3-necked round bottomed flask equipped with a magnetic stirring bar, a thermometer and a graduated pressure equalized addition funnel sealed with a septum cap was comprehensively flushed with $N_2$. The system was then charged with lithium aluminium hydride powder (21.30 g, 561 mmol) and anhydrous THF (468 mL) via the addition funnel. A solution of Bicyclo $NPr_2$ Diimide (61.81 g, 187.1 mmol) in anhydrous THF (2339 mL) was then transferred to the addition funnel. The diimide solution was then added slowly to the LAH solution and upon full addition the reaction was refluxed for 24 hours. The reaction was then cooled to 5° C. and quenched with water (21.3 mL), 15% NaOH solution (21.3 mL) and water (63.9 mL) keeping the temperature below 10° C.

After warming to room temperature and suction filtration of the solids followed by washing with dichloromethane (1123 mL), water (374 mL) was added to the combined filtrates which were then acidified using c.HCl to pH=1–2. The organic layer was then separated, water (374 mL) added and the pH adjusted to 1–2 with c.HCl. This aqueous layer was separated and combined with the previous aqueous fraction, basified with 50% NaOH solution to pH=11–12 and extracted with dichloromethane (5×468 mL). These combined organic fractions were dried over $Na_2SO_4$, filtered and evaporated in vacuo to give a yellow solid (45.14 g, 88%). The solid was then soxhlet extracted with ether (350 mL) for 2 hours, the resulting ether solution being cooled and the solvent evaporated under vacuum to give a cream crystalline solid (41.63 g, 81%).

Melting Point: 62.0–63.2° C.

$^{13}C$ in $CDCl_3$ (δ/ppm): 12.113; 21.984; 35.629; 44.257; 58.316; 58.822; 135.313.

$^1H$ in $CDCl_3$ (δ/ppm): 0.87 (6H, t); 1.46 (4H, q6); 1.86 (4H, t); 2.28 (4H, t); 2.49 (6H, br.d); 3.03 (4H, t); 6.07 (2H, t).

Combustion Analysis for $C_{18}H_{30}N_2$:

|  | % C | % H | % N |
|---|---|---|---|
| Calculated | 78.78 | 11.02 | 10.21 |
| Found | 78.53 | 11.27 | 10.32 |

Example 3

Synthesis of N,N'-Dipropyl-N,N'-diethylbicyclo[2.2.2]oct-7-ene-2,3:5,6-dipyrrolidinium Diiodide (Bicyclo $NPr_2Et_2$ Diquat)

To a 500 mL 3-necked round bottomed flask equipped with a magnetic stirring bar, a reflux condenser, a thermometer and a pressure equalized addition funnel containing a solution of iodoethane (35.09 g, 225 mmol) in ethanol (113 mL) were attached. The flask was then charged with Bicyclo $NPr_2$ Diamine (20.58 g, 75 mmol) and ethanol (75 mL). After stirring until all the solids had dissolved the iodoethane solution was added slowly and the mixture refluxed overnight. After subsequent cooling to 10° C. ether (188 mL) was added to completely precipitate the solids which were then suction filtered and washed with acetone (75 mL). The resultant orange solids were dried in a vacuum dessicator over drierite (33.15 g, 75%). These solids were then refluxed in acetone (400 mL) for 15 minutes, suction filtered, washed with acetone (100 mL) and dried in a vacuum dessicator over drierite to give an orange solid (30.67 g, 70%).

Melting Point: 299.8–303.2° C.

$^{13}C$ in $D_2O$ (δ/ppm): 10.172; 12.764; 19.147; 35.737; 42.637; 56.316; 64.538; 67.458; 136.915.

$^1H$ in $D_2O$ (δ/ppm): 0.94 (6H, t); 1.28 (6H, t); 1.70 (4H, m); 2.87 (10H, s+br.d); 3.17 (4H, m); 3.32 (4H, q4); 3.82 (4H, br.d); 6.45 (2H, t).

Combustion Analysis for $C_{22}H_{40}N_2I_2$

|  | % C | % H | % N |
|---|---|---|---|
| Calculated | 45.06 | 6.88 | 4.78 |
| Found | 43.89 | 7.09 | 4.76 |

Example 4

Synthesis of N,N'-Diisopropylbicyclo[2.2.2]oct-7-ene-2,3:5,6-tetracarboxylic Diimide (Bicyclo $NPr^i_2$ Diimide)

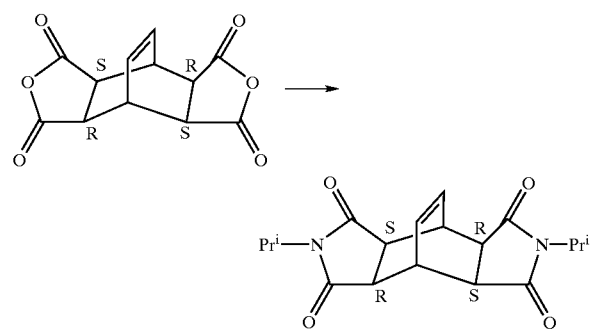

R,S—Notation Defines the Stereochemistry

To a 2000 mL, 3-necked round bottomed flask equipped with a magnetic stirring bar, a reflux condenser and a thermometer, a pressure equalized dropping funnel charged with water (600 mL) was attached. The flask was then charged with iso-propylamine (472.89 g, 8 moles) followed by bicyclo[2.2.2]oct-7-ene-2,3:5,6-tetracarboxylic dianhydride (99.28 g, 0.4 moles) in portions along with vigorous stirring. After two hours of stirring at room temperature, the water was carefully added. The mixture was then stirred at 70° C. for 48 hours. The reaction was then cooled to room temperature and the majority of the remaining iso-propylamine distilled off until the reaction volume was ~500 mL. Then water was added (600 mL) and the remaining iso-propylamine quenched with c.HCl in a dropwise fashion. The solid was then filtered under suction, washed with water (200 mL) and dried in a vacuum dessicator over drierite to give 127.19 g (96%) of diimide as a white solid.

Melting Point: 278.6–279.5° C.

$^{13}C$ in $CDCl_3$ (δ/ppm): 19.090; 33.732; 42.570; 43.990; 130.704; 176.724.

$^1H$ in $CDCl_3$ (δ/ppm): 1.28 (6H, s); 1.30 (6H, s); 2.89 (4H, t); 3.73 (2H, m); 4.26 (2H, q5); 6.11 (2H, dd).

Combustion Analysis for $C_{18}H_{22}N_2O_4$

|  | % C | % H | % N |
|---|---|---|---|
| Calculated | 65.44 | 6.71 | 8.48 |
| Found | 65.40 | 6.70 | 8.42 |

Combustion Analysis for $C_{18}H_{30}N_2$

|  | % C | % H | % N |
|---|---|---|---|
| Calculated | 78.78 | 11.02 | 10.21 |
| Found | 78.94 | 11.35 | 10.28 |

Example 5

Synthesis of N,N'-Diisopropylbicyclo[2.2.2]oct-7-ene-2,3:5,6-dipyrrolidine (Bicyclo $NPr^i_2$ Diamine)

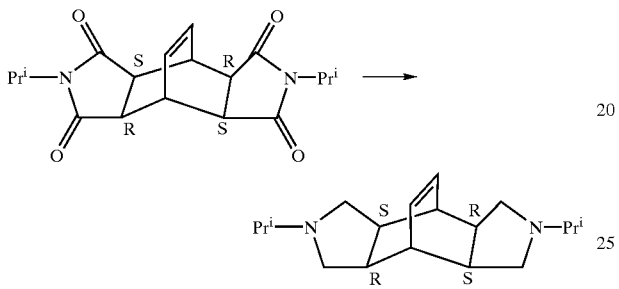

Example 6

Synthesis of N,N'-Diisopropyl-N,N'-dipropylbicyclo[2.2.2]oct-7-ene-2,3:5,6-dipyrrolidinium Diiodide (Bicyclo $NPr^i_2Pr_2$ Diquat)

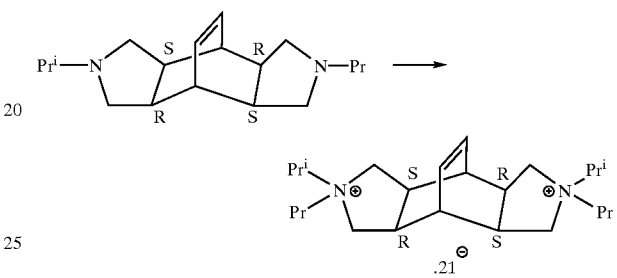

R,S—Notation Defines the Stereochemistry

A 5000 mL, 3-necked round bottomed flask equipped with a magnetic stirring bar, a thermometer and a graduated pressure equalized addition funnel sealed with a septum cap was comprehensively flushed with $N_2$. The system was then charged with lithium aluminium hydride powder (22.93 g, 604 mmol) and anhydrous THF (503 mL) via the addition funnel. A solution of Bicyclo $NPr^i_2$ Diimide (66.52 g, 201.35 mmol) in anhydrous THF (2517 mL) was then transferred to the addition funnel. The diimide solution was then added slowly to the LAH solution and upon full addition the reaction was refluxed for 48 hours. The reaction was then cooled to 5° C. and quenched with water (22.9 mL), 15% NaOH solution (22.9 mL) and water (68.8 mL) keeping the temperature below 10° C. After warming to room temperature and suction filtration of the solids followed by washing with dichloromethane (1208 mL), water (403 mL) was added to the combined filtrates which were then acidified using c.HCl to pH=1–2. The organic layer was then separated, water (403 mL) added and the pH adjusted to 1–2 with c.HCl. This aqueous layer was separated and combined with the previous aqueous fraction, basified with 50% NaOH solution to pH=11–12 and extracted with dichloromethane (5×503 mL). These combined organic fractions were dried over $Na_2SO_4$, filtered and evaporated in vacuo to give a yellow solid (52.52 g, 95%). The solid was then soxhlet extracted with ether (350 mL) for 2 hours, the resulting ether solution being cooled and the solvent evaporated under vacuum to give a yellow solid (41.92 g, 76%).

Melting Point: 154.5–156.0° C.

$^{13}C$ in $CDCl_3$ (δ/ppm): 21.879; 35.699; 44.179; 54.824; 56.784; 135.397.

$^1H$ in $CDCl_3$ (δ/ppm): 1.03 (6H, s); 1.05 (6H, s); 1.88 (4H, t); 2.24 (4H, q5); 2.49 (6H, br.d); 3.13 (4H, t); 6.07 (2H, t).

R,S—Notation Defines the Stereochemistry

To a 100 mL, 3-necked round bottomed flask equipped with a magnetic stirring bar, a reflux condenser and a thermometer, a pressure equalized addition funnel containing a solution of 1-iodopropane (10.2 g, 60 mmol) in ethanol (30 mL) was attached. The flask was then charged with Bicyclo $NPr^i_2$ Diamine (5.49 g, 20 mmol) and ethanol (20 mL). After stirring until all the solids had dissolved the 1-iodopropane solution was added slowly and the mixture refluxed overnight. After subsequent cooling to 10° C. ether (50 mL) was added to completely precipitate the solids which were then suction filtered and washed with acetone (20 mL). The resultant pale pink solids were dried in a vacuum dessicator over drierite (11.04 g, 90%).

Melting Point: 307.7–308.8° C. decomp.

$^{13}C$ in $D_2O$ (δ/ppm): 13.061; 19.420; 19.588; 36.633; 43.568; 61.962; 65.728; 67.885; 137.337.

$^1H$ in $D_2O$ (δ/ppm):0.96 (6H, t); 1.33 (12H, m); 1.79 (4H, m); 2.89 (10H, m);3.20 (4H, m); 3.72 (6H, m); 6.49 (2H, t).

Combustion Analysis for $C_{24}H_{44}N_2I_2$

|  | % C | % H | % N |
|---|---|---|---|
| Calculated | 46.92 | 7.22 | 4.56 |
| Found | 45.00 | 7.08 | 4.62 |

Example 7

Synthesis of Borosilicate MCM-70

7 g of Colloidal Silica (30 wt. %), $H_3BO_3$ (Boric acid 4 wt. % solution), KOH (Potassium Hydroxide, 20 wt. % solution), Bicyclo $NPr_2Et_2$ Diquat $I_2$ (N,N'-Dipropyl-N,N'-diethylbicyclo[2.2.2]oct-7-ene-2,3:5,6-dipyrrolidinium diiodide, solid of Example 3) and distilled water were combined in the following molar ratios:

| | |
|---|---|
| Si/B$_2$ | 10 |
| H$_2$O/Si | 30 |
| OH/Si | 0.4 |
| K$^+$/Si | 0.4 |
| Bicyclo NPr$_2$Et$_2$ Diquat I$_{22}$/Si | 0.20 |

The combined mixture was added to an autoclave and heated to 160° C. for 300 hours. The product was then filtered and washed with water and dried overnight under an IR lamp. The solid is subsequently calcined in air at a temperature of 540° C. for 8 hours to yield the new material designated as MCM-70. The powder x-ray diffraction patterns of the as-synthesized and calcined materials are given in FIGS. 1 and 2, and the corresponding peak lists are compiled in Table 3 and 4, respectively.

Example 8

Synthesis of Borosilicate MCM-70

7 g of Colloidal Silica (30 wt. %), H$_3$BO$_3$ (Boric acid 4 wt. % solution), KOH (Potassium Hydroxide, 20 wt. % solution), Bicyclo NPr$^i_2$Pr$_2$ Diquat I$_2$ (N,N'-Diisopropyl-N,N'-dipropylbicyclo[2.2.2]oct-7-ene-2,3:5,6-dipyrrolidinium diiodide, solid of Example 6) and distilled water were combined in the following molar ratios:

| | |
|---|---|
| Si/B$_2$ | 10 |
| H$_2$O/Si | 30 |
| OH/Si | 0.4 |
| K$^+$/Si | 0.4 |
| Bicyclo NPr$^i_2$Pr$_2$ Diquat I$_2$/Si | 0.20 |

The combined mixture was added to an autoclave and heated to 160° C. for 300 hours. The product was then filtered and washed with water and dried overnight under an IR lamp. The solid is subsequently calcined in air at a temperature of 540° C. for 8 hours to yield the new material designated as MCM-70.

TABLE 3

| 2θ (°) | d$_{hkl}$ (Å) | 100 I$_o$/I$_{max}$ |
|---|---|---|
| 12.20 | 7.25 | 61.8 |
| 13.34 | 6.63 | 9.5 |
| 17.63 | 5.03 | >1.0 |
| 19.10 | 4.64 | 2.3 |
| 20.24 | 4.38 | 5.2 |
| 20.47 | 4.33 | 20.9 |
| 20.88 | 4.25 | 6.1 |
| 21.52 | 4.13 | 3.7 |
| 21.68 | 4.10 | 21.1 |
| 22.55 | 3.94 | 5.1 |
| 22.69 | 3.92 | 9.1 |
| 23.05 | 3.85 | 1.5 |
| 23.34 | 3.81 | >1.0 |
| 24.50 | 3.63 | 41.3 |
| 25.03 | 3.55 | >1.0 |
| 25.52 | 3.49 | 22.9 |
| 26.82 | 3.32 | 67.4 |
| 27.80 | 3.21 | 43.8 |
| 28.11 | 3.17 | 100.0 |
| 28.92 | 3.08 | 4.6 |
| 29.66 | 3.01 | 11.6 |
| 30.76 | 2.904 | 1.1 |
| 30.95 | 2.887 | >1.0 |
| 31.29 | 2.856 | >1.0 |

TABLE 3-continued

| 2θ (°) | d$_{hkl}$ (Å) | 100 I$_o$/I$_{max}$ |
|---|---|---|
| 31.64 | 2.826 | 1.6 |
| 33.95 | 2.638 | 5.8 |
| 34.72 | 2.582 | 9.3 |
| 35.26 | 2.543 | 3.0 |
| 36.56 | 2.456 | 5.2 |
| 37.12 | 2.420 | 14.8 |
| 38.64 | 2.328 | 7.4 |
| 38.96 | 2.310 | 17.5 |
| 39.20 | 2.296 | 6.6 |
| 39.48 | 2.281 | 2.3 |
| 40.07 | 2.248 | 1.4 |
| 40.38 | 2.232 | 8.0 |
| 41.04 | 2.197 | 12.0 |
| 42.00 | 2.150 | 2.9 |
| 42.41 | 2.130 | 1.5 |
| 42.69 | 2.116 | >1.0 |
| 43.82 | 2.064 | 2.4 |
| 44.09 | 2.052 | >1.0 |
| 44.38 | 2.039 | 4.5 |
| 46.09 | 1.968 | 23.4 |
| 48.19 | 1.887 | 7.7 |
| 48.86 | 1.863 | 18.0 |
| 50.18 | 1.817 | 5.5 |
| 50.70 | 1.799 | 1.3 |
| 51.91 | 1.760 | 9.7 |
| 53.05 | 1.725 | 2.8 |
| 53.27 | 1.718 | 2.1 |

TABLE 4

| 2θ (°) | d$_{hkl}$ (Å) | 100 I$_o$/I$_{max}$ |
|---|---|---|
| 12.23 | 7.23 | 100.0 |
| 13.18 | 6.71 | 21.2 |
| 17.57 | 5.04 | 1.4 |
| 18.95 | 4.68 | 6.5 |
| 20.07 | 4.42 | 3.5 |
| 20.56 | 4.32 | 5.8 |
| 20.74 | 4.28 | 20.2 |
| 21.44 | 4.14 | 4.9 |
| 21.62 | 4.11 | 42.4 |
| 22.61 | 3.93 | 32.4 |
| 23.06 | 3.85 | 4.0 |
| 24.31 | 3.66 | 3.0 |
| 24.63 | 3.61 | 27.0 |
| 25.41 | 3.50 | 20.6 |
| 26.58 | 3.35 | 78.1 |
| 27.57 | 3.23 | 36.0 |
| 28.20 | 3.16 | 78.7 |
| 28.99 | 3.08 | 3.0 |
| 29.51 | 3.02 | 10.1 |
| 30.70 | 2.910 | 1.9 |
| 30.89 | 2.892 | 2.6 |
| 31.28 | 2.857 | 1.6 |
| 31.92 | 2.801 | >1.0 |
| 32.14 | 2.783 | 1.0 |
| 33.92 | 2.640 | 3.7 |
| 34.66 | 2.586 | 3.3 |
| 35.04 | 2.559 | 5.4 |
| 36.50 | 2.460 | 2.8 |
| 37.37 | 2.405 | 5.0 |
| 38.63 | 2.329 | 10.1 |
| 39.13 | 2.300 | 5.0 |
| 39.42 | 2.284 | 3.2 |
| 39.93 | 2.256 | 3.3 |
| 40.16 | 2.244 | 3.3 |
| 40.82 | 2.209 | 9.4 |
| 42.27 | 2.136 | 1.3 |
| 44.09 | 2.052 | 3.8 |
| 44.27 | 2.044 | 2.7 |
| 45.74 | 1.982 | 3.0 |
| 46.49 | 1.952 | 5.4 |
| 48.73 | 1.867 | 13.0 |
| 50.07 | 1.820 | 4.6 |

TABLE 4-continued

| 2θ (°) | $d_{hkl}$ (Å) | 100 $I_o/I_{max}$ |
|---|---|---|
| 51.51 | 1.773 | 4.2 |
| 52.74 | 1.734 | >1.0 |
| 54.72 | 1.676 | >1.0 |

What is claimed is:

1. A synthetic porous crystalline material characterized by an X-ray diffraction pattern including values substantially as set forth in Table 1 of the specification and having a composition comprising the molar relationship $$X_2O_3:(n)YO_2,$$

wherein n is at least about 2, X is a trivalent element, and Y is a tetravalent element.

2. The crystalline material of claim 1 having a composition, on an anhydrous basis and in terms of moles of oxides per n moles of $YO_2$, expressed by the formula:

$$(0.05-2)M_2O:(0.01-2)Q:X_2O_3:(n)YO_2$$

wherein M is alkali or alkaline earth metal and Q is an organic moiety.

3. The crystalline material of claim 2 wherein said Q comprises a dication selected from N,N'-dipropyl-N,N'-diethylbicyclo[2.2.2]oct-7-ene-2,3:5,6-dipyrrolidinium dication, N,N'-dipropyl-N,N'-diethylbicyclo[2.2.2]octane-2,3:5,6-dipyrrolidinium dication, N,N'-diisopropyl-N,N'-dipropylbicyclo[2.2.2]oct-7-ene-2,3:5,6-dipyrrolidinium dication and N,N'-diisopropyl-N,N'-dipropylbicyclo[2.2.2]octane-2,3:5,6-dipyrrolidinium dication.

4. The crystalline material of claim 1 wherein X is a trivalent element selected from the group consisting of boron, iron, indium, gallium, aluminum, and a combination thereof; and Y is a tetravalent element selected from the group consisting of silicon, tin, titanium, germanium, and a combination thereof.

5. The crystalline material of claim 1 wherein X comprises boron and Y comprises silicon.

6. A method for synthesizing the crystalline material of claim 5 which comprises (i) preparing a mixture capable of forming said material, said mixture comprising sources of water, alkali or alkaline earth metal (M), an oxide of boron, an oxide of tetravalent element (Y) and an organic directing agent (Q) selected from N,N'-dipropyl-N,N'-diethylbicyclo[2.2.2]oct-7-ene-2,3:5,6-dipyrrolidinium dication, N,N'-dipropyl-N,N'-diethylbicyclo[2.2.2]octane-2,3:5,6-dipyrrolidinium dication, N,N'-diisopropyl-N,N'-dipropylbicyclo[2.2.2]oct-7-ene-2,3:5,6-dipyrrolidinium dication or N,N'-diisopropyl-N,N'-dipropylbicyclo[2.2.2]octane-2,3:5,6-dipyrrolidinium dication, having a composition, in terms of mole ratios, within the following ranges:

| $YO_2/B_2O_3$ | 2–100,000 |
|---|---|
| $H_2O/YO_2$ | 10–1000 |
| $OH^-/YO_2$ | 0.05–2 |
| $M/YO_2$ | 0.05–2 |
| $Q/YO_2$ | 0.01–2. |

(ii) maintaining said mixture under sufficient conditions including a temperature of from about 100° C. to about 240° C. until crystals of said material are formed; and (iii) recovering said crystalline material from step (ii).

7. The method of claim 6 wherein the mixture has a composition, in terms of mole ratios, within the following ranges:

| $YO_2/B_2O_3$ | 5–100 |
|---|---|
| $H_2O/YO_2$ | 20–50 |
| $OH^-/YO_2$ | 0.2–0.8 |
| $M/YO_2$ | 0.2–0.8 |
| $Q/YO_2$ | 0.1–0.3. |

8. A process for converting a feedstock comprising organic compounds to conversion product which comprises contacting said feedstock at organic compound conversion conditions with a catalyst comprising an active form of the synthetic porous crystalline material of claim 1.

* * * * *